(12) United States Patent
Dhong et al.

(10) Patent No.: US 6,502,224 B2
(45) Date of Patent: Dec. 31, 2002

(54) METHOD AND APPARATUS FOR SYNTHESIZING LEVELIZED LOGIC

(75) Inventors: Sang Hoo Dhong, Austin, TX (US); Harm Peter Hofstee, Austin, TX (US); Stephen Douglas Posluszny, Round Rock, TX (US); Joel Abraham Silberman, Somers, NY (US); Osamu Takahashi, Round Rock, TX (US); Dieter F. Wendel, Schoenaich (DE)

(73) Assignee: International Business Machines Corporation, Armonk, NY (US)

( * ) Notice: Subject to any disclaimer, the term of this patent is extended or adjusted under 35 U.S.C. 154(b) by 62 days.

(21) Appl. No.: 09/833,413

(22) Filed: Apr. 12, 2001

(65) Prior Publication Data

US 2002/0152450 A1 Oct. 17, 2002

(51) Int. Cl.[7] .............................................. G06F 17/50
(52) U.S. Cl. ................................. 716/6; 716/7; 716/18
(58) Field of Search ........................... 716/6, 7, 10, 16, 716/18

(56) References Cited

U.S. PATENT DOCUMENTS

| | | | | | |
|---|---|---|---|---|---|
| 5,359,535 A | * | 10/1994 | Djaja et al. | ................. | 327/261 |
| 5,396,435 A | * | 3/1995 | Ginetti | ......................... | 703/19 |
| 5,404,311 A | * | 4/1995 | Isoda | ........................... | 703/19 |
| 5,636,130 A | * | 6/1997 | Salem et al. | .................... | 716/6 |
| 6,148,434 A | * | 11/2000 | Nozuyama | ..................... | 716/6 |
| 6,209,121 B1 | * | 3/2001 | Goto | ............................. | 716/6 |
| 6,253,361 B1 | * | 6/2001 | Buch | ............................. | 716/6 |
| 6,311,148 B1 | * | 10/2001 | Krishnamoorthy | .......... | 703/14 |
| 6,317,861 B1 | * | 11/2001 | Hasegawa | ..................... | 716/5 |
| 6,341,363 B1 | * | 1/2002 | Hasegawa | ..................... | 716/6 |
| 6,425,115 B1 | * | 7/2002 | Risler et al. | .................. | 716/17 |

OTHER PUBLICATIONS

Wakerly, John F., Digital Design: Principles and Practices, 2nd ed., Englewood Cliffs, NJ: Prentice Hall 1994, pp. 635–640.

* cited by examiner

*Primary Examiner*—Don Wong
*Assistant Examiner*—Shih-Chao Chen
(74) *Attorney, Agent, or Firm*—Duke W. Yee; Casimer K. Salys; Michael R. Nichols

(57) ABSTRACT

A method and apparatus for synthesizing logic circuits with synchronized outputs is disclosed. A logic designer selects a fixed number of levels in which to synthesize the circuit, each level implementing a plurality of different logic function all having the same propagation delay. Circuit outputs are synchronized by ensuring that each logic function is synthesized by connecting logic functions from level to level such that each signal path passes through each level once and only once.

23 Claims, 4 Drawing Sheets

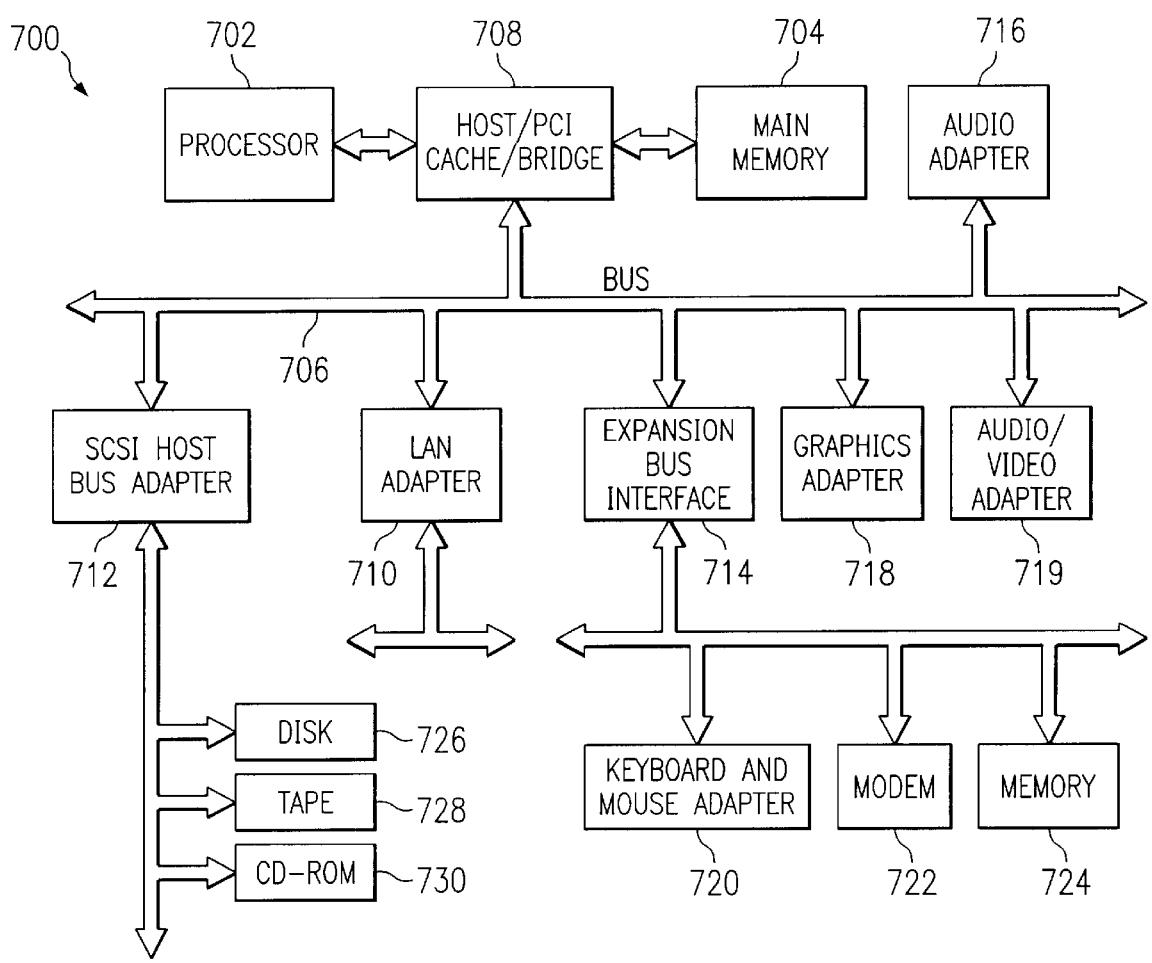

METHOD AND APPARATUS FOR SYNTHESIZING LEVELIZED LOGIC

BACKGROUND OF THE INVENTION

1. Technical Field

The present invention relates generally to a technique for synthesizing logic circuits. More specifically the present invention relates to a logic synthesis technique in which propagation delays across circuits are equalized.

2. Description of Related Art

Digital logic circuitry is becoming increasingly prevalent in all kinds of devices. Many systems that were once operated through mechanical or analog electronic means are now controlled through digital electronics. Audio technology, including both home stereo equipment and the telephone system, is increasingly dominated by digital technology. Vehicles such as airplanes and automobiles, which were once controlled largely through mechanical means, are now primarily controlled by digital computers. Digital signal processing and digital wireless communications are just now beginning to replace long-dominant analog communications technology.

Designers of digital logic circuitry today generally use synthesis tools, computer programs for deriving a low-level implementation of a logic circuit from a high-level representation of logic functions. For instance, a designer may wish to connect two D-type flip-flops in series. The designer will specify to the synthesis tool that two D-type flip-flops connected in series are desired. The synthesis tool will then select circuit schematics for the two flip-flops from a standard library and combine the schematics to derive a low-level (logic-gate level) implementation for the circuit. In many synthesis tools, a designer has the option of choosing different design goals, such as power minimization, speed optimization, and so forth, so that the schematics picked from the standard library address these goals.

These schematics can then be translated into a physical form. Methods for translating a schematic into a physical form include deriving an integrated circuit layout directly from the schematic using some sort of integrated circuit compiler, and implementing the circuit in some kind of programmable logic device (PLD).

Programmable logic devices, including programmable logic arrays (PLAs), are integrated circuits containing connected blocks of circuitry for performing basic logic functions. A circuit design is "programmed" or "burned" into a PLD by eliminating those connections between circuitry blocks that are not needed (by, for instance, blowing an internal fuse in the PLD, in the case of a "fuse-programmable" PLD) or defining certain wiring levels within the PLD (in the case of a "mask-programmable" PLD).

Conventional logic circuit synthesis techniques, however, suffer from a number of drawbacks. In complex circuits containing many signal paths, propagation delays (delays of signals through a circuit from input to output) can easily become unequal, which causes synchronization problems, particularly at high speeds.

Programmable logic arrays (PLAS), which are a type of PLD, solve the problem of synchronizing outputs, but only for simple circuits. PLAs are generally made up of arrays of AND and OR logic gates, and can be used to synthesize 2-level logic functions using a level of ANDs and a level of ORs. For simple circuits that can be implemented using a two-level AND-OR schematic, PLAs are an adequate solution, but for more complex circuits they are not.

What is needed, then, is a synthesis technique for producing circuits with synchronized outputs that is applicable for more complicated circuits, and a tool for implementing the technique.

SUMMARY OF THE INVENTION

The present invention is directed toward a method of synthesizing logic circuits having synchronized outputs, which method can be used in a synthesis tool for computer-aided engineering of logic circuits. The technique involves the a priori selection of a fixed number of logic "levels," in which each level has a fixed propagation delay associated with it. Each level can include several logic functions, with each logic function in the level having the same propagation delay.

The logic circuit(s) to be implemented are then synthesized by connecting logic functions from one level to the next, so that every signal path must pass through each level once and only once. Logic circuits that are too complex to be synthesized using the number of levels chosen can be synthesized by partitioning the circuit into pieces that can each be synthesized using the levels available.

The physical result of such synthesis can be implemented using discrete logic components, or as a custom-fabricated integrated circuit using a standard integrated circuit compiler or layout tool, or in one or more programmable logic devices containing circuitry for each level.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

FIG. 7 is a block diagram of a data processing system in the present invention may be implemented.

DETAILED DESCRIPTION OF THE DRAWINGS

Figure 1:
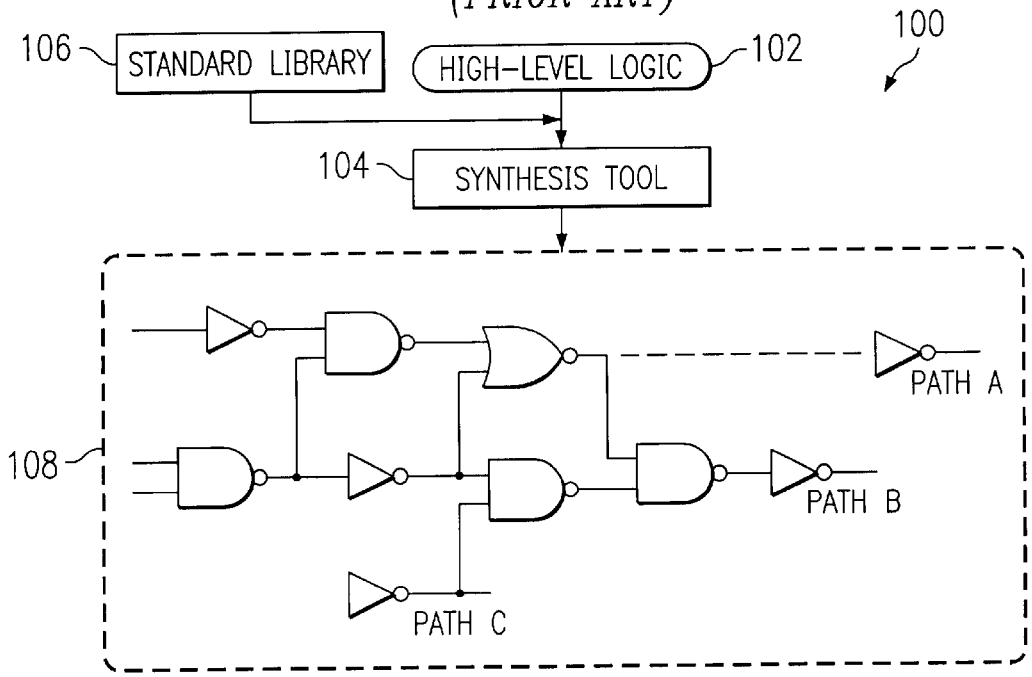
FIG. 1 is a diagram depicting an overall view of a conventional approach to logic circuit synthesis.

FIG. 1 is a diagram depicting a conventional approach 100 to multi-level logic circuit synthesis. High level representations of logical functions 102, made up of combinations high-level functions such as adders and multiplexers and lower-level functions such as boolean logic gates, are input into synthesis tool 104. Synthesis tool 104, a program operating in a data processing system, substitutes low-level logic sub-circuits for the high-level functions in high-level representations 102, by retrieving the sub-circuits from a standard library 106. Resulting circuit 108 is a combination of logic sub-circuits.

Figure 2:
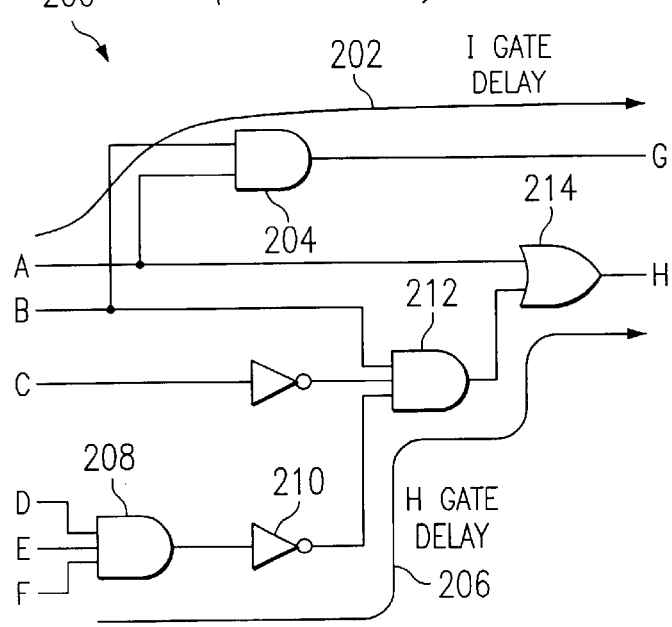
FIG. 2 is a schematic diagram of a circuit synthesized in accordance with a conventional approach.

As FIG. 2 demonstrates, the circuits synthesized in this way may contain many data paths through different logic gates. In other words, electrical signals from a set of inputs may travel through different paths through logic gates before finally reaching an output. Each of these data paths has a different delay associated with it, called a propagation delay. The propagation delay of a data path within a circuit is the amount of time it takes for information entering the path to be reflected in the output of the path. The propagation delay of a path is, roughly speaking, a function of the number and types of logic gates on the path. If a signal must flow through more gates, the delay will be longer.

Circuit 200 in FIG. 2, for example, includes (among others) two data paths with very different propagation delays. Path 202, which runs from input A to output G, has a one-gate delay, because the electrical signals along path 202 passes only through AND-gate 204. (For the purpose of example, it is assumed that all of the logic gates have the same propagation delay. In reality, this is often not the case.). Path 206, which runs from input F to output H, has a four-gate delay, because the electrical signals traveling along path 206 must pass through four gates: AND-gate 208, inverter 210, AND-gate 212, and OR-gate 214.

Figure 3:
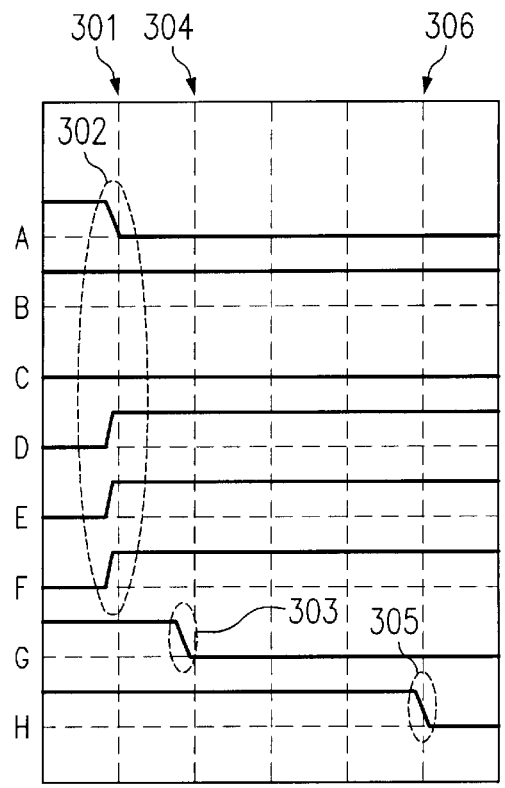
FIG. 3 is a timing diagram derived from the circuit in FIG. 2.

As FIG. 3 demonstrates, the disparity in path delays can pose performance problems. FIG. 3 depicts a timing diagram 300 for circuit 200 in FIG. 2. At time 301, the values of inputs A–F (302) change. Because the longest data path to output G has only one gate of delay, output G changes to its new value (303) at time 304. Output H, however, because its longest data path is four gates long, does not stabilize to its new value (305) until time 306.

Because of this time discrepancy between one output and another, circuit 200 and circuits like it are inefficient. To illustrate why this is so, one should imagine a situation in which both outputs (G and H) are to be simultaneously latched (stored) into a register, flip-flops, or other storage circuit. In order to do this, it is necessary for inputs A–F to be held at their new value from time 301 until at least three gates worth of delay (plus any necessary setup and hold time for the latch) afterwards.

The reason for this is that output G must hold its new value for at least long enough for output H to update its value. Only when both outputs simultaneously reflect their accurate new value can the two outputs be latched. In order for output G to hold its value that long, it is necessary for the inputs that determine the value of output G to hold their values for at least three gates worth of delay. Of course, holding some inputs longer than others in a circuit like this can make the circuit maddeningly complex. Often, the best solution in these instances is simply to hold all of the inputs equally long. As one of ordinary skill in the art will appreciate, holding values as a means of synchronization in this way can significantly lower the performance of a digital circuit.

Figure 4:
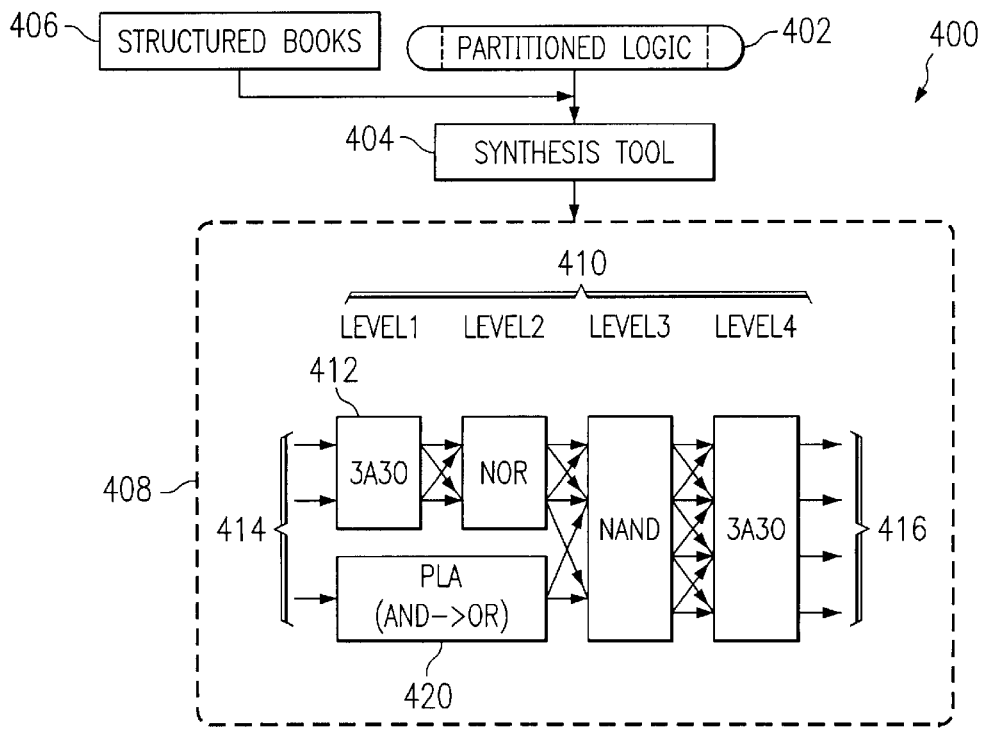
FIG. 4 is a diagram depicting an overall view of an approach to logic circuit synthesis in accordance with an embodiment of the present invention.

FIG. 4 is a diagram of an overall view of an approach 400 to circuit synthesis in accordance with an embodiment of the present invention. High-level logic representations 402 are partitioned into pieces that can be implemented using levelized logic (q.v.). Synthesis tool 404 substitutes levelized sub-circuits from structured books 406 for some of the higher level functions in 402. Structured books 406 include circuit schematics for logic functions with standardized propagation delays. Using logic functions with standardized propagation delays makes ensuring uniform propagation delays within a level simple.

The result is a circuit such as circuit 408, which is implemented by dividing the circuit into a fixed number of "levels" of logic circuitry. Dividing the circuit into levels in this way is called "levelized logic." Circuit 408, for instance, has four levels 410. Each level has a fixed delay time associated with it, which may be the same delay time as of other levels, but need not be. The number of levels is fixed prior to logic synthesis taking place.

At each level, a number of logic functions may be defined. Any combinational or sequential logic function may be used within a given level, as long as all of the propagation delays within a given level are the same. A combinational logic function is a logic function whose outputs depend only on its current inputs, such as an AND gate. A sequential logic function is a logic function whose inputs depend both on its current inputs and past inputs; in other words, a sequential logic function is state-aware.

For instance, in level 1 of circuit 408, both a 3-by-3 AND-OR function 412 and a mask-programmable programmable logic array (PLA) 420 are defined. AND-OR function 412 has a propagation delay equal to that of level 1. PLA 420 has a propagation delay equal to the sum of the propagation delays for level 1 and level 2; therefore, it occupies both levels. PLAs such as PLA 420 generally have a fixed propagation delay, because they are often comprised of an array of 2-stage AND-OR circuits.

Because the propagation delays for all logic functions in a given level are the same, a synchronized set of inputs applied to a level yields a synchronized set of outputs. Thus, when input signals are applied to inputs 414, outputs 416 change to the proper new value simultaneously.

For a complex logic circuit to be implemented using this levelized logic scheme, one of two things must occur. There must either be enough levels for the entire logic circuit to be implemented as a multi-level circuit, or the circuit must be partitioned into smaller pieces, where each piece may be implemented using the number of levels available.

Choosing the number of levels to be used, which must be done before synthesis takes place, requires two major considerations to be taken into account. The first of these, which was just touched upon, is the complexity of the circuitry to be implemented; more complicated logic circuits can require more levels.

The second major consideration is clock speed. Many digital logic circuits, particularly those used in computers, are synchronized using a clock signal, which is usually some sort of square wave. The rising or falling edge of a clock signal is often used to latch (store) data from a bus into a register, flip-flop, random access memory (RAM), or other storage circuitry. It is generally desirable to have all latched outputs of a logic circuit synchronized at the point at which the latching is to occur.

Thus, it is generally desirable to pick a number of levels that results in an overall propagation delay of just under one clock cycle. Having the propagation delay be just under one clock cycle allows the logic circuit to be synchronized with the clock cycle such that the circuit outputs reflect the proper values for a short setup time before being latched.

Of course, the actual number of levels picked depends on the logic functions and physical technology used at each level. Some logic functions take longer to perform. For instance, an AND-gate may have a longer propagation delay than a NAND (not-and) gate in certain technologies. Also, some physical technologies are faster than others. For instance, emitter-coupled logic (ECL) technology is generally faster than complementary metal-oxide semiconductor (CMOS) technology. Also, within the same technology, different feature sizes (the size of the individual components on an integrated circuit) account for differences in performance.

Figure 5:
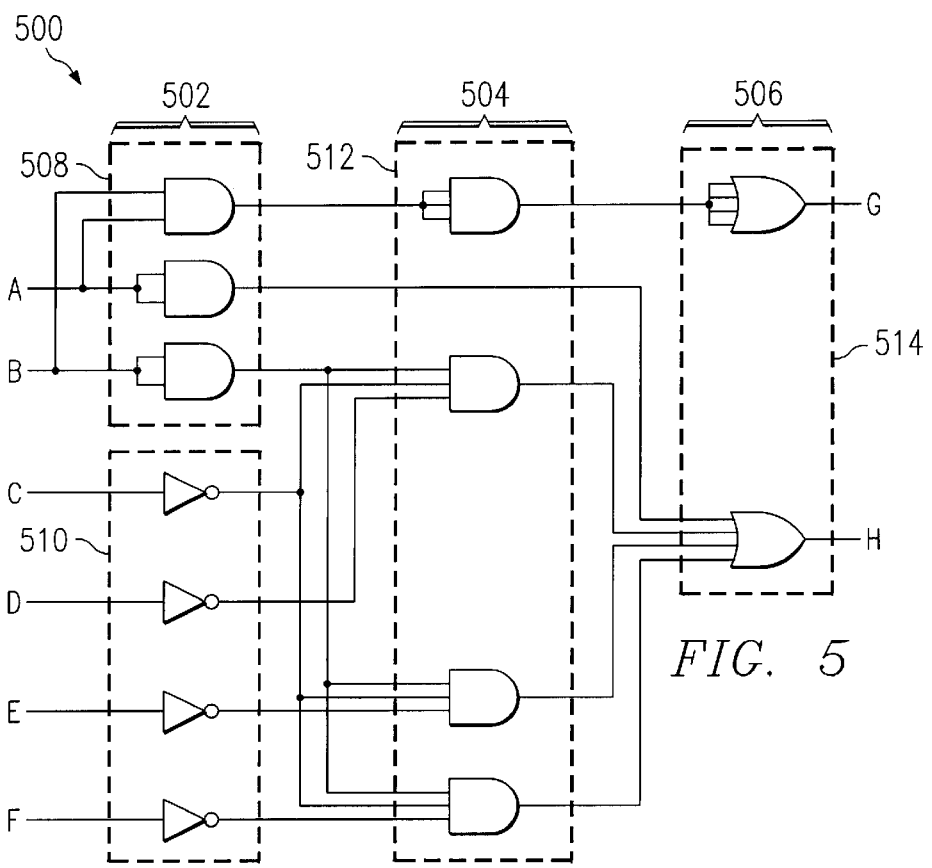
FIG. 5 is a schematic diagram of a logic circuit performing the same logical functions as FIG. 2, but produced in accordance with an embodiment of the present invention.

FIG. 5 provides a schematic diagram of a logic circuit 500 to perform the same function as circuit 200 in FIG. 2, but designed in accordance with an embodiment of the present invention. Circuit 500 is divided into three levels 502, 504, and 506.

In level 502, two logic functions are defined: 2-input AND function 508 and inverter function 510. The gates providing the functionality to AND function 508 and inverter function 510 all have the same propagation delay.

In fabricating circuits for use in a level, it is generally advisable to fabricate all logic gates or other logic subcircuits used in a single level on the same monolithic integrated circuit in close proximity to one another. When related circuits are fabricated in close proximity in an integrated circuit, manufacturing variations that may affect propagation delays will (in theory, at least) affect the related circuits similarly.

A preferred method of fabricating circuits using this levelized approach is to manufacture all of the levels on a single monolithic integrated circuit as a programmable logic device (PLD), where the connections between levels are specified by software and programmed into the chip using conventional programmable logic techniques.

Levels 504 and 506 define one logic function each. Level 504 includes a 3-input AND function 512, and level 506 defines a 4-input OR function 514. It is important to realize at this point that although each of the logic functions within a single level have the same propagation delay, logic functions within different levels may have different propagation delays. For instance, 2-input AND function 502 and inverter function 510 must have equivalent propagation delays (or at least be very close to each other), but 2-input AND function 502 and 3-input AND function 512 need not.

Figure 6:
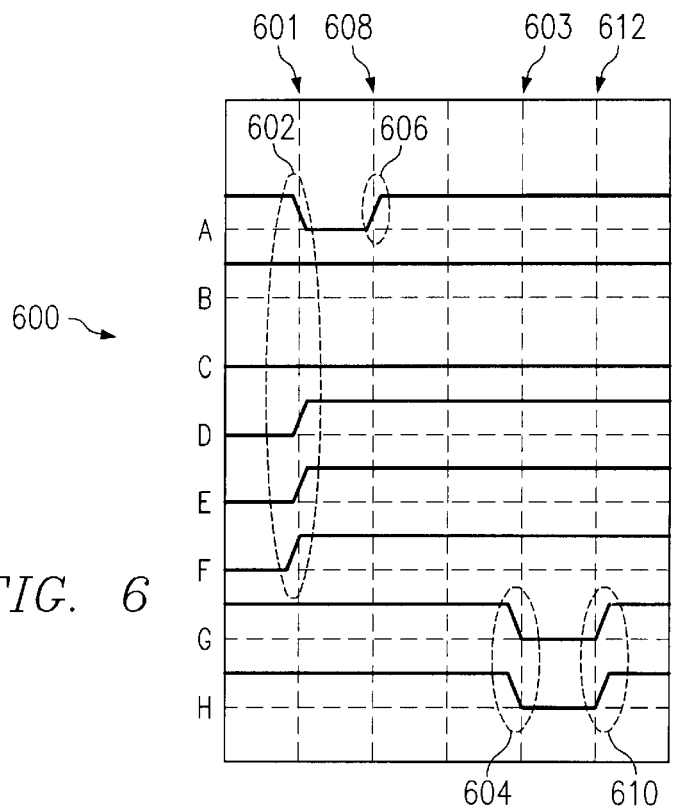
FIG. 6 is a timing diagram derived from the circuit in FIG. 5.

FIG. 6 provides a timing diagram 600 demonstrating the operation of circuit 500 in FIG. 5. At time 601, the values of inputs A–F change (602). At time 603, three levels of delay later, both output G and output H take on their new values simultaneously.

Because outputs G and H are synchronized, outputs A–F may be varied more quickly. When input A, for instance, is varied quickly (606) at time 608, the correct signals for outputs G and H appear (610) at time 612, three levels of delay after the change takes place. Recall that in circuit 200 in FIG. 2, inputs A–F had to be held at their values for some three or more gates worth of delay to achieve synchronized outputs. In embodiment of the present invention described in FIG. 6, outputs G and H are always synchronized, so no extensive hold time is necessary.

With reference to FIG. 7, a block diagram of a data processing system 700 in which the processes of the present invention may be implemented is illustrated. It should be noted that in addition to performing the circuit synthesis operations of the present invention, data processing system 700 may itself contain circuitry synthesized by the operations of the present invention. Processor 702, for instance, is made up of digital logic circuits that may be synthesized using the present invention.

Data processing system 700 employs a peripheral component interconnect (PCI) local bus architecture. Although the depicted example employs a PCI bus, other bus architectures such as Micro Channel and ISA may be used. Processor 702 and main memory 704 are connected to PCI local bus 706 through PCI bridge 708. PCI bridge 708 also may include an integrated memory controller and cache memory for processor 702. Additional connections to PCI local bus 706 may be made through direct component interconnection or through add-in boards. In the depicted example, local area network (LAN) adapter 710, SCSI host bus adapter 712, and expansion bus interface 714 are connected to PCI local bus 706 by direct component connection. In contrast, audio adapter 716, graphics adapter 718, and audio/video adapter (A/V) 719 are connected to PCI local bus 706 by add-in boards inserted into expansion slots. Expansion bus interface 714 provides a connection for a keyboard and mouse adapter 720, modem 722, and additional memory 724. SCSI host bus adapter 712 provides a connection for hard disk drive 726, tape drive 728, CD-ROM 730, and digital video disc read only memory drive (DVD-ROM) 732 in the depicted example. Typical PCI local bus implementations will support three or four PCI expansion slots or add-in connectors. Those of ordinary skill in the art will appreciate that the hardware in FIG. 7 may vary. For example, other peripheral devices, such as optical disk drives and the like may be used in addition to or in place of the hardware depicted in FIG. 7. The depicted example is not meant to imply architectural limitations with respect to the present invention.

It is important to note that while the present invention has been described in the context of a fully functioning data processing system, those of ordinary skill in the art will appreciate that the processes of the present invention are capable of being distributed in the form of a computer readable medium of instructions and a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method for synthesizing a logic circuit, comprising the steps of:

establishing a plurality of levels, wherein each of the plurality of levels is associated with a level-wide propagation delay;

establishing a plurality of logic functions associated with respective ones of the plurality of levels, plurality of levels, to have propagation delays incremented by an amount associated with each of the plurality of levels;

establishing a plurality of inputs;

establishing a plurality of outputs; and establishing a plurality of connections connecting selected logic functions from the plurality of levels to form an implementation of the logic circuit, such that an electrical signal traveling between a selected input and corresponding output will pass through a logic function associated with each of the plurality of levels once.

2. The method of claim 1, wherein the plurality of functions includes a logic function that spans more than one level.

3. The method of claim 1, further comprising partitioning a larger logic circuit to form a plurality of circuit fragments, wherein the logic circuit is taken from the plurality of circuit fragments.

4. The method of claim 1, wherein the sum of the level-wide propagation delays from each of the plurality of levels is less than or equal to a clock cycle time.

5. The method of claim 1, wherein the plurality of logic functions for one of the plurality of levels includes one of a combinational logic circuit and a sequential logic circuit.

6. The method of claim 1, wherein the plurality of logic functions for one of the plurality of levels includes a function to be implemented by a programmable logic device (PLD).

7. The method of claim 1, wherein the subset has a cardinality of one.

8. The method of claim 1, further comprising retrieving at least a portion of the logic circuit from a structured book.

9. A computer program product, in a computer-readable medium, for synthesizing a logic circuit, comprising instructions for:

establishing a plurality of levels, wherein each of the plurality of levels is associated with a level-wide propagation delay;

establishing a plurality of logic functions associated with respective ones of the plurality of levels, plurality of levels, to have propagation delays incremented by an amount associated with each of the plurality of levels;

establishing a plurality of inputs;

establishing a plurality of outputs; and establishing a plurality of connections connecting selected logic functions from the plurality of levels to form an implementation of the logic circuit, such that an electrical signal traveling between a selected input and corresponding output will pass through a logic function associated with each of the plurality of levels once.

10. The computer program product of claim 9, wherein the plurality of functions includes a logic function that spans more than one level.

11. The computer program product of claim 9, further comprising instructions for partitioning a larger logic circuit to form a plurality of circuit fragments, wherein the logic circuit is taken from the plurality of circuit fragments.

12. The computer program product of claim 9, wherein the sum of the level-wide propagation delays from each of the plurality of levels is less than or equal to a clock cycle time.

13. The computer program product of claim 9, wherein the plurality of logic functions for one of the plurality of levels includes one of a combinational logic circuit and a sequential logic circuit.

14. The computer program product of claim 9, wherein the plurality of logic functions for one of the plurality of levels includes a function to be implemented by a programmable logic device (PLD).

15. The computer program product of claim 9, wherein the subset has a cardinality of one.

16. The computer program product of claim 9, further comprising instructions for retrieving at least a portion of the logic circuit from a structured book.

17. A data processing system to synthesize a logic circuit, comprising:

a bus system;

a memory connected to the bus system, wherein the memory contains a set of instructions; and a processing unit, wherein the processing unit includes at least one processor, wherein the processing unit executed the set of instructions to perform the acts of:

establishing a plurality of levels, wherein each of the plurality of levels is associated with a level-wide propagation delay;

establishing a plurality of logic functions associated with respective ones of the plurality of levels, plurality of levels, to have propagation delays incremented by an amount associated with each of the plurality of levels;

establishing a plurality of inputs;

establishing a plurality of outputs; and establishing a plurality of connections connecting selected logic functions from the plurality of levels to form an implementation of the logic circuit, such that an electrical signal traveling between a selected input and corresponding output will pass through a logic function associated with each of the plurality of levels once.

18. The data processing system of claim 17, wherein the plurality of functions includes a logic function that spans more than one level.

19. The data processing system of claim 17, wherein the processing unit executes the set of instructions to perform the additional act of partitioning a larger logic circuit to form a plurality of circuit fragments, wherein the logic circuit is taken from the plurality of circuit fragments.

20. The data processing system of claim 17, wherein the sum of the level-wide propagation delays from each of the plurality of levels is less than or equal to a clock cycle time.

21. The data processing system of claim 17, wherein the plurality of logic functions for one of the plurality of levels includes one of a combinational logic circuit and a sequential logic circuit.

22. The data processing system of claim 17, wherein the plurality of logic functions for one of the plurality of levels includes a function to be implemented by a programmable logic device (PLD).

23. The data processing system of claim 17, wherein the processing unit executes the set of instructions to perform the additional act of retrieving at least a portion of the logic circuit from a structured book.

* * * * *